(12) United States Patent
Cheng et al.

(10) Patent No.: US 8,199,485 B2
(45) Date of Patent: Jun. 12, 2012

(54) COMPUTER SERVER SYSTEM AND FAN MODULE THEREOF

(75) Inventors: Hao-Der Cheng, Taipei Hsien (TW); Wen-Tang Peng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 242 days.

(21) Appl. No.: 12/638,998

(22) Filed: Dec. 16, 2009

(65) Prior Publication Data

US 2011/0134594 A1   Jun. 9, 2011

(30) Foreign Application Priority Data

Dec. 3, 2009   (TW) ................................ 98141431 A

(51) Int. Cl.
*H05K 7/20* (2006.01)
*G06F 1/20* (2006.01)

(52) U.S. Cl. ........... 361/679.5; 361/679.48; 361/679.49; 361/694; 361/695

(58) Field of Classification Search ............. 361/679.31, 361/679.48, 679.49, 679.5, 694, 695
See application file for complete search history.

(56) References Cited

U.S. PATENT DOCUMENTS

| | | | | |
|---|---|---|---|---|
| 4,774,631 A | * | 9/1988 | Okuyama et al. ............. | 361/695 |
| 5,210,680 A | * | 5/1993 | Scheibler ...................... | 361/695 |
| 5,788,467 A | * | 8/1998 | Zenitani et al. ............... | 417/360 |
| 5,854,738 A | * | 12/1998 | Bowler .......................... | 361/695 |
| 5,973,921 A | * | 10/1999 | Lin ................................ | 361/695 |
| 6,104,607 A | * | 8/2000 | Behl ......................... | 361/679.49 |
| 6,164,369 A | * | 12/2000 | Stoller ..................... | 165/104.33 |
| 6,269,001 B1 | * | 7/2001 | Matteson et al. ............. | 361/695 |
| 6,317,320 B1 | * | 11/2001 | Cosley et al. ................ | 361/695 |
| 6,504,717 B1 | * | 1/2003 | Heard ............................ | 361/695 |
| 6,594,148 B1 | * | 7/2003 | Nguyen et al. ................ | 361/695 |
| 6,714,411 B2 | * | 3/2004 | Thompson et al. ............ | 361/695 |
| 6,775,139 B2 | * | 8/2004 | Hsueh ........................... | 361/697 |
| 6,865,078 B1 | * | 3/2005 | Chang ........................... | 361/695 |
| 6,876,549 B2 | * | 4/2005 | Beitelmal et al. ............. | 361/692 |
| 6,888,725 B2 | * | 5/2005 | Kubo et al. ................... | 361/719 |
| 6,889,752 B2 | * | 5/2005 | Stoller ............................ | 165/47 |
| 6,961,242 B2 | * | 11/2005 | Espinoza-Ibarra et al. ... | 361/695 |
| 7,012,807 B2 | * | 3/2006 | Chu et al. ...................... | 361/699 |
| 7,016,191 B2 | * | 3/2006 | Miyamoto et al. ........ | 361/679.33 |
| 7,043,739 B2 | * | 5/2006 | Nishiyama et al. ........... | 720/600 |
| 7,054,155 B1 | * | 5/2006 | Mease et al. .................. | 361/695 |
| 7,236,361 B2 | * | 6/2007 | Cote et al. ..................... | 361/695 |
| 7,301,768 B2 | * | 11/2007 | Fan et al. ...................... | 361/695 |
| 7,342,786 B2 | * | 3/2008 | Malone et al. ................ | 361/695 |
| 7,580,259 B2 | * | 8/2009 | Hsiao ............................ | 361/695 |

(Continued)

FOREIGN PATENT DOCUMENTS

EP    1793384 A2 *  6/2007

(Continued)

*Primary Examiner* — Anatoly Vortman
(74) *Attorney, Agent, or Firm* — Altis Law Group, Inc.

(57) ABSTRACT

A fan module for dissipating heat from a computer server includes a mounting bracket and a fan mounted on the mounting bracket. The mounting bracket is mounted to an outside of the computer server. The mounting bracket is hollow and forms an air passage in an interior of the mounting bracket. The air passage is communicated with an interior of the computer server. An airflow generated by the fan flows into the interior of the computer server through the air passage to take heat away from the interior of the computer server.

11 Claims, 3 Drawing Sheets

U.S. PATENT DOCUMENTS

| | | | |
|---|---|---|---|
| 7,630,198 B2 * | 12/2009 | Doll | 361/679.49 |
| 7,639,496 B2 * | 12/2009 | Lv et al. | 361/695 |
| 7,804,690 B2 * | 9/2010 | Huang et al. | 361/724 |
| 7,813,121 B2 * | 10/2010 | Bisson et al. | 361/679.51 |
| 7,845,903 B2 * | 12/2010 | Li | 415/186 |
| 7,862,410 B2 * | 1/2011 | McMahan et al. | 454/184 |
| 8,031,467 B2 * | 10/2011 | Cheng et al. | 361/694 |
| 2001/0004311 A1 * | 6/2001 | Negishi | 361/695 |
| 2001/0029163 A1 * | 10/2001 | Spinazzola et al. | 454/184 |
| 2003/0223193 A1 * | 12/2003 | Smith et al. | 361/687 |
| 2004/0130868 A1 * | 7/2004 | Schwartz et al. | 361/687 |
| 2004/0207983 A1 * | 10/2004 | Lu et al. | 361/695 |
| 2006/0120040 A1 * | 6/2006 | Chen | 361/695 |
| 2006/0285292 A1 * | 12/2006 | Fan et al. | 361/695 |
| 2007/0064386 A1 * | 3/2007 | Peng et al. | 361/687 |
| 2007/0171613 A1 * | 7/2007 | McMahan et al. | 361/695 |
| 2007/0274039 A1 * | 11/2007 | Hamlin | 361/695 |
| 2008/0180903 A1 * | 7/2008 | Bisson et al. | 361/687 |
| 2009/0056910 A1 * | 3/2009 | Mallia et al. | 165/80.3 |
| 2009/0097203 A1 * | 4/2009 | Byers et al. | 361/695 |
| 2009/0109619 A1 * | 4/2009 | Wise et al. | 361/695 |
| 2009/0168324 A1 * | 7/2009 | Lai et al. | 361/679.33 |
| 2009/0257192 A1 * | 10/2009 | Li | 361/695 |
| 2009/0303678 A1 * | 12/2009 | Ishimine et al. | 361/679.48 |
| 2010/0033930 A1 * | 2/2010 | Wada | 361/695 |
| 2011/0096499 A1 * | 4/2011 | Li | 361/695 |
| 2011/0122573 A1 * | 5/2011 | Peng et al. | 361/679.48 |

FOREIGN PATENT DOCUMENTS

JP          10268979 A  * 10/1998

* cited by examiner

COMPUTER SERVER SYSTEM AND FAN MODULE THEREOF

BACKGROUND

1. Technical Field

The present disclosure relates to computer server systems, and more particularly to a computer server system having a fan module mounted to an outside of a computer server for dissipating heat away from the computer server.

2. Description of Related Art

Computer server systems are known in the art and commonly used to process and store data and information in networks. Typically, a computer server system has multiple standard servers mounted in a server cabinet. The servers are usually arranged in the server cabinet one-by-one from a bottom-to-top direction of the server cabinet. For standard servers, rack unit (U) is the unit of measurement of heights of the servers. One rack unit (1U) is 1.75 inches. The servers each can be one (1U), two (2U) or n rack units (nU).

Each server is a stand-alone computer and includes an enclosure and a plurality of electronic components such as one or more processors, RAM, fixed disks, AC to DC power supplies received in the enclosure. As the server contains these electronic components, a lot of heat is generated during operation. Thus, each of the servers generally further contains a plurality of fans in the enclosure for removing the heat generated by the electronic components of the server. During operation, the fans draw cooling air from an outside of the server into an interior of the server. The cooling air flows through these electronic components to exchange heat with them. Finally, the hot air flows out of the server to carry the heat away from the server.

As information technology continues to rapidly progress, old servers are generally required to be updated with new ones, so as to enhance the processing capacity and performance of the servers. The fans in the old servers are often discarded whether or not the fans are competent in heat dissipation for the new servers, because the new servers generally have an internal layout different from that of the old servers. Thus, it is a waste for the fans, and accordingly the cost for updating the servers is increased.

Furthermore, in recent years, the number of electronic components in a server continually increases to achieve high performance while space that the server occupies remains the same or is even reduced. Thus, density of the electronic components in the server is increased. As a result, it is hard to find space in the server for accommodating fans.

What is desired, therefore, is a computer server system which can overcome the above described shortcomings.

DETAILED DESCRIPTION

Figure 1:
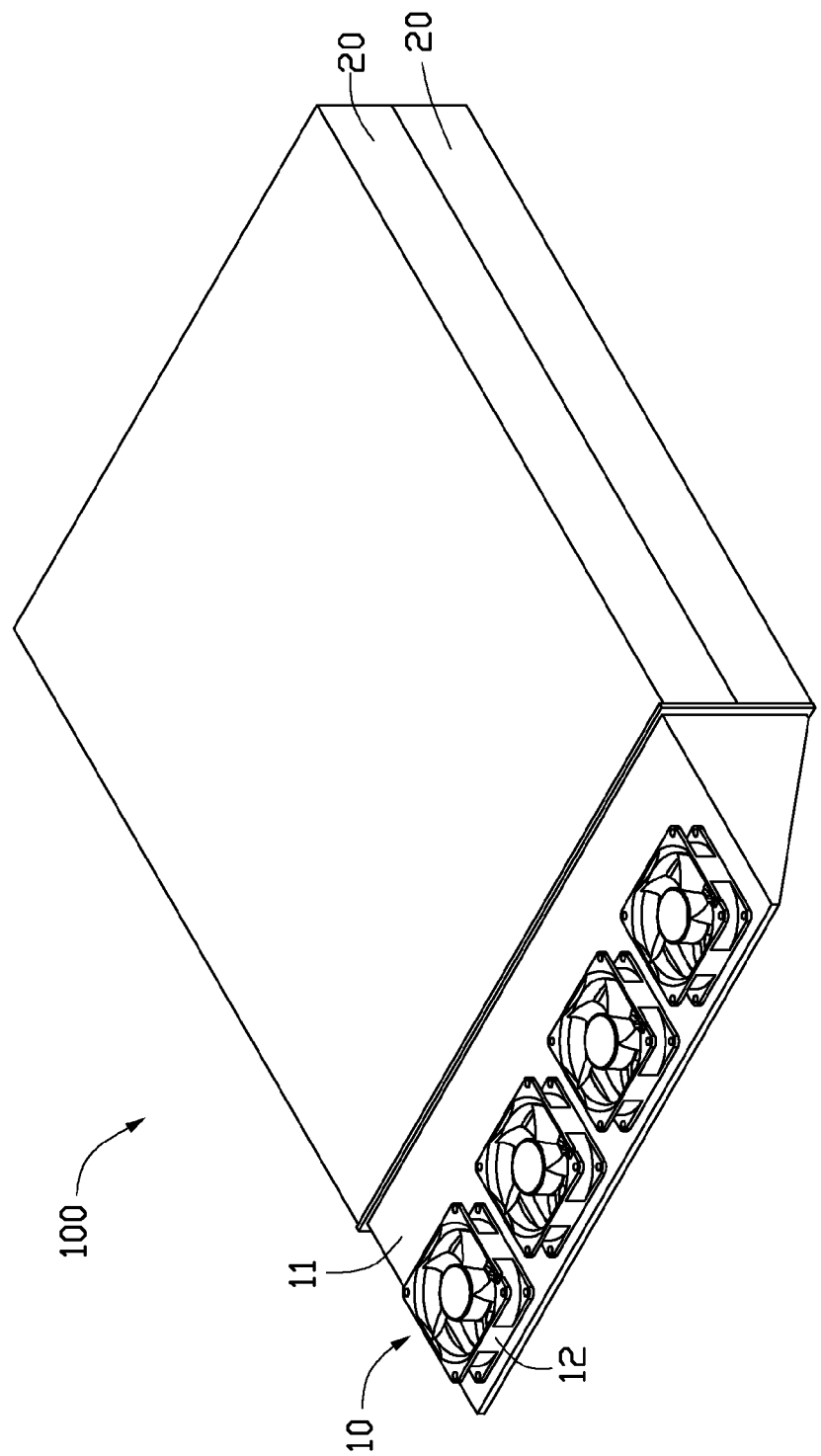
FIG. 1 is an isometric, assembled view of a computer server system in accordance with an embodiment of the present disclosure.

Reference will now be made to the drawing figures to describe the present computer server system in detail.

Figure 2:
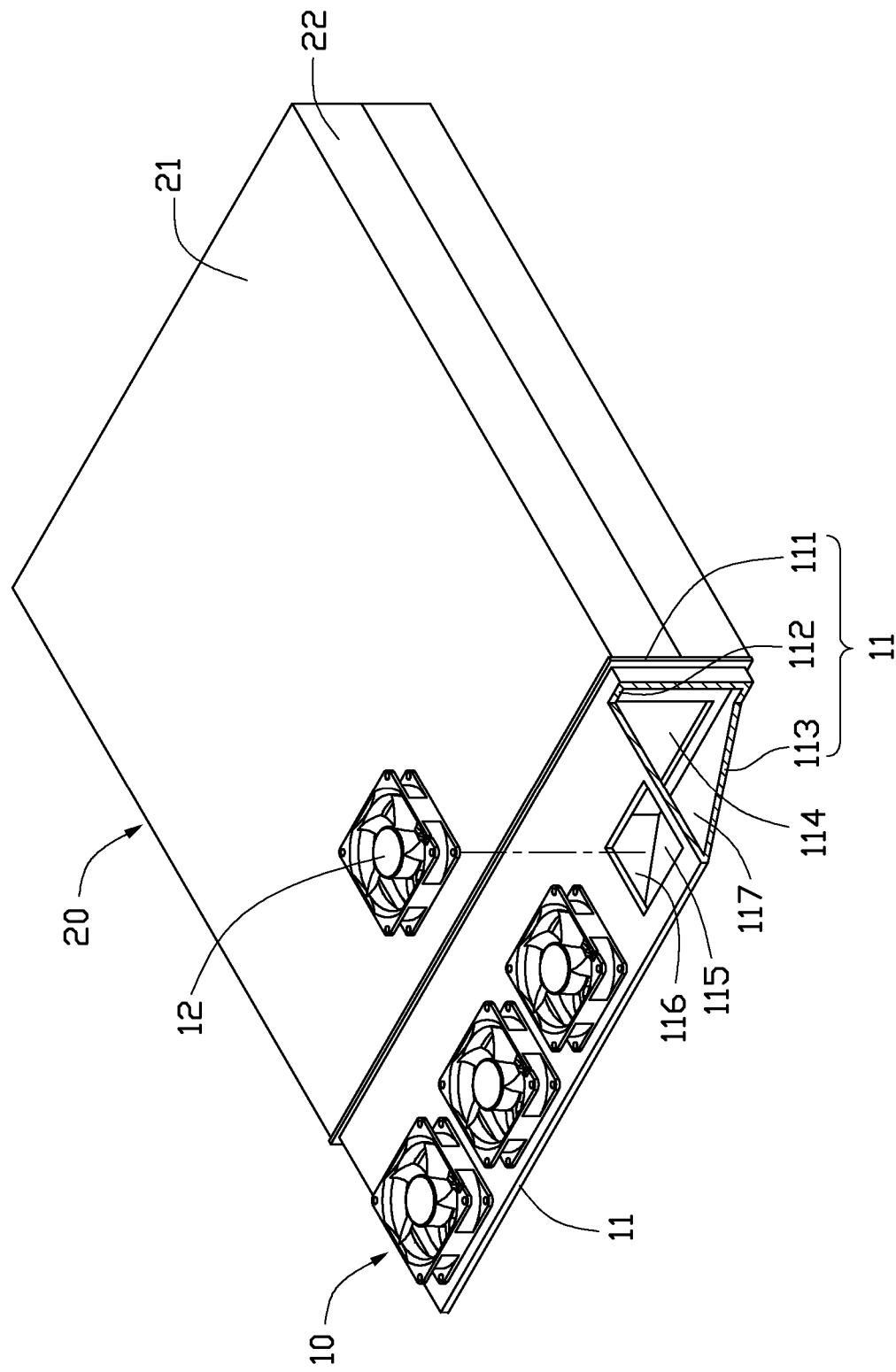
FIG. 2 is similar to FIG. 1, but with a portion of a fan module of the computer server system being removed for clarity.

Referring to FIGS. 1-2, a computer server system 100 according an embodiment of the present disclosure is shown. The computer server system 100 includes two servers 20 and a fan module 10 mounted to an outside of the two servers 20. The two servers 20 are stacked together along heightwise directions thereof. The fan module 10 is used to simultaneously dissipate heat of the two servers 20. Each of the servers 20 has a standard rectangular outline and is a 1U server. A server cabinet (not shown) can be provided to receive the two servers 20 and the fan module 10 therein.

Each of the servers 20 includes an enclosure 21 and a plurality of electronic components such as one or more processors, RAM, fixed disks, AC to DC power supplies in the enclosure 21. The enclosure 21 includes multiple sidewalls 22.

The fan module 10 includes a mounting bracket 11 and four fans 12 mounted on the mounting bracket 11. The mounting bracket 11 is mounted to front sidewalls 22 of the enclosures 21 of the servers 20.

The mounting bracket 11 is hollow and has a triangular traverse cross section. The mounting bracket 11 includes a mounting plate 111, a supporting plate 112 and an air guiding plate 113. The mounting plate 111 is mounted to the front sidewalls 22 of the enclosures 21 and is parallel to the front sidewalls 22. The supporting plate 112 is perpendicular to the mounting plate 111 and extends horizontally outwardly from a top edge of the mounting plate 111. The supporting plate 112 is substantially coplanar with a top surface of the enclosure 21 of the server 20. The air guiding plate 113 is inclinedly connected between a bottom edge of the mounting plate 111 and a front free end of the supporting plate 112, so as to guiding air from the fans 12 to the servers 20. The mounting plate 111 defines four ventilation holes 114 corresponding to the four fans 12. The four ventilation holes 114 are evenly spaced from each other in the mounting plate 111 and communicated with an interior of each of the servers 20. Each of the four ventilation holes 114 has a height greater than a height of each of the servers 20.

The four fans 12 are mounted on the supporting plate 112 and arranged along a direction perpendicular to the heightwise direction of the server 20. The supporting plate 112 defines four through holes 115 corresponding to the four fans 12. The through holes 115 are evenly spaced from each other in the supporting plate 112 and perpendicular to the ventilation holes 114. The four fans 12 are mounted on the supporting plate 112 with each fan 12 located corresponding to a through hole 115.

A plurality of partition plates 116 are provided in an interior of the mounting bracket 11, with each partition plate 116 arranged between two neighboring fans 12. Thus, the interior of the mounting bracket 11 is divided by the partition plates 116 into four air passages 117. The four air passages 117 correspond respectively to the four fans 12, and each air passage 117 is connected between a corresponding through hole 115 and a corresponding ventilation hole 114.

In use, airflows generated by the fans 12 are guided into the interior of the server 20 through the air passages 117 of the mounting bracket 11. Thus, heat in the servers 20 is removed away by the airflows of the fans 12.

Figure 3:
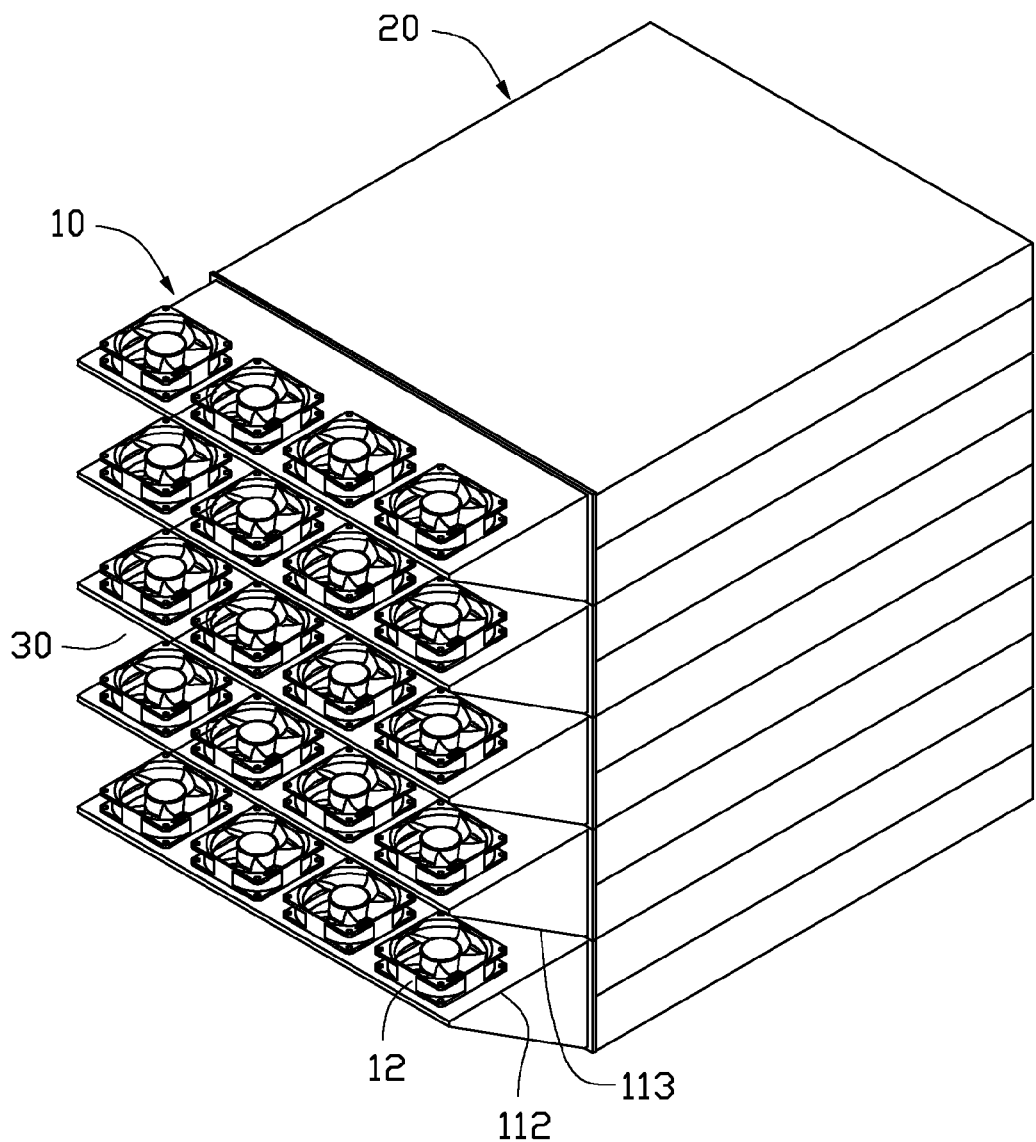
FIG. 3 is an isometric, assembled view of a computer server system according to an alternative embodiment of the present disclosure.

FIG. 3 shows a computer server system in accordance with an alternative embodiment of the present disclosure. In this embodiment, a plurality of servers 20 are stacked together along heightwise directions thereof. A plurality of fan modules 10 are mounted to identical sides of the servers 20 and stacked along the heightwise directions of the servers 20. Every two neighboring servers 20 are provided with a fan module 10. Since the air guiding plate 113 of each fan module 10 is inclinedly disposed, a space 30 is defined between the supporting plate 112 of a bottom fan module 10 and the air guiding plate 113 of a top fan module 10. The fans 12 of the bottom fan module 10 are received in the space 30 under the top fan module 10.

In the present embodiments, the fan module 10 is disposed outside the servers 20. An internal layout of the server 20 is not relevant to the installation of the fan module 10. Thus, when the servers 20 are updated with new ones, the fan module 10 can continue to use on the new servers 20, thereby saving money and reducing cost. Furthermore, since the fans 12 are mounted to an outside of the servers 20, fans with greater size can be used to provide a more powerful airflow. Also, if a single fan 12 of the fan module 10 is damaged, the damaged fan 12 can be easily substituted by a new one.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A computer server system, comprising:
   at least one server; and
   a fan module mounted to an outside of the at least one server, the fan module including a mounting bracket and a plurality of fans mounted on the mounting bracket and arranged along a direction perpendicular to a heightwise direction of the at least one server, the mounting bracket being hollow and forming a plurality of air passages in an interior of the mounting bracket corresponding to the plurality of fans, the plurality of air passages being communicated with an interior of the at least one server, airflow generated by the plurality of fans flowing into the interior of the at least one server through the plurality of air passages to take heat away from the interior of the at least one server.

2. The computer server system of claim 1, wherein the at least one server comprises two servers stacked together, the fan module spans across the two servers and take heat away from the two servers simultaneously.

3. The computer server system of claim 1, wherein the mounting bracket includes a mounting plate, a supporting plate connected to the mounting plate, and an air guiding plate connected between the supporting plate and the mounting plate, the mounting plate is mounted to an enclosure of the at least one server, the at least one fan is mounted on the supporting plate, and the air guiding plate guides the airflow of the plurality of fans to the corresponding air passages.

4. The computer server system of claim 3, wherein the mounting bracket has a triangular traverse cross section, the supporting plate is perpendicular to the mounting plate and extends horizontally outwardly away from the at least one server from a top edge of the mounting plate, the air guiding plate is inclinedly connected between a bottom edge of the mounting plate and a free end of the supporting plate away from the at least one server.

5. The computer server system of claim 3, wherein the mounting plate defines a plurality of ventilation holes facing the at least one server, the supporting plate defines a plurality of through holes corresponding to the plurality of ventilation holes, each of the plurality of fans is mounted on the supporting plate and faces a corresponding through hole, each air passage is formed between the corresponding ventilation hole and the corresponding through hole.

6. The computer server system of claim 1, wherein a plurality of partition plates are provided in the interior of the mounting bracket, each of the plurality of partition plates is arranged between two neighboring fans, and the plurality of partition plates are spaced from each other along the same direction along which the fans being arranged to divide the interior of the mounting bracket into the plurality of air passages.

7. A fan module adapted for removing heat from a computer server, comprising:
   a mounting bracket adapted for being mounted to an outside of the computer server, the mounting bracket being hollow and forming at least one air passage in an interior of the mounting bracket; and
   at least one fan mounted at an exterior of the mounting bracket, for generating an airflow to cool the computer server; and
   wherein the mounting bracket comprises a mounting plate, a supporting plate connected to the mounting plate, and an air guiding plate connected between the supporting plate and the mounting plate, the mounting plate is for being mounted to the computer server, at least one ventilation hole is defined in the mounting plate for intercommunicating the at least one air passage and an interior of the computer server, the supporting plate defines at least one through hole communicating the at least one air passage, the at least one fan is mounted on the supporting plate and aligned with the at least one through hole, the air guiding plate guides the airflow of the at least one fan to move along the at least one air passage;
   wherein the mounting bracket has a triangular traverse cross section, the supporting plate is perpendicular to the mounting plate and extends horizontally outwardly from a top edge of the mounting plate, the air guiding plate is inclinedly connected between a bottom edge of the mounting plate and a free end of the supporting plate.

8. The fan module of claim 7, wherein the at least one fan comprises a plurality of fans, at least one partition plate is provided in an interior of the mounting bracket, the at least one partition plate is arranged between two neighboring fans, the interior of the mounting bracket is divided by the at least one partition plate into a plurality of air passages.

9. A computer server system, comprising:
   a plurality of servers stacked along heightwise directions thereof; and
   a plurality of fan modules mounted to identical sides of the servers and being stacked along the heightwise direction of the servers, each of the fan modules including a mounting bracket and a plurality of fans mounted on the mounting bracket along a direction perpendicular to the heightwise direction of the servers, the bracket having a triangular traverse cross section, and comprising a mounting plate, a supporting plate with a lateral side connected to a lateral side of the mounting plate, and an air guiding plate slantwise connected between the supporting plate and the mounting plate, the mounting plate being mounted to the servers, the fans being mounted on the supporting plate, the mounting bracket being hollow, an interior of the mounting bracket being communicated with an interior of the servers, airflow generated by the fans flowing into the interior of the servers through the interior of the mounting bracket; and
   a space being defined between every two adjacent mounting brackets, the space being formed between the supporting plate of a lower one of the two adjacent mounting brackets and the air guiding plate of an upper one of the two adjacent mounting brackets, the fans on the lower one of the two adjacent mounting brackets being received in the space between the two adjacent mounting brackets.

10. The computer server system of claim 9, wherein a plurality of partition plates are provided in the interior of the mounting bracket, the partition plates being spaced from each other to divide the interior of the mounting bracket into a plurality of air passages corresponding to the fans of the mounting bracket, each of the air passages being communicated with the interior of the at least one of the servers mounted with the mounting bracket, airflow generated by each of the fans flowing into the interior of the server through a corresponding air passage.

11. The computer server system of claim 9, wherein each of the fan modules spans across at least two of the servers and take heat away from the at least two of the servers simultaneously.

* * * * *